United States Patent
Chen et al.

(10) Patent No.: US 8,779,520 B2
(45) Date of Patent: *Jul. 15, 2014

(54) ERASABLE PROGRAMMABLE SINGLE-PLOY NONVOLATILE MEMORY

(71) Applicant: eMemory Technology Inc., Hsin-Chu (TW)

(72) Inventors: Wei-Ren Chen, Pingtung County (TW); Te-Hsun Hsu, Hsinchu County (TW); Wen-Hao Lee, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/893,794

(22) Filed: May 14, 2013

(65) Prior Publication Data

US 2013/0248973 A1 Sep. 26, 2013

Related U.S. Application Data

(63) Continuation-in-part of application No. 13/572,731, filed on Aug. 13, 2012, now Pat. No. 8,592,886, which is a continuation-in-part of application No. 13/415,185, filed on Mar. 8, 2012.

(51) Int. Cl.
*H01L 27/115* (2006.01)
*H01L 29/78* (2006.01)

(52) U.S. Cl.
USPC .............. 257/365; 257/E27.06; 257/E29.304

(58) Field of Classification Search
None
See application file for complete search history.

(56) References Cited

U.S. PATENT DOCUMENTS

| | | | |
|---|---|---|---|
| 5,736,764 | A | 4/1998 | Chang |
| 5,761,121 | A | 6/1998 | Chang |
| 5,841,165 | A | 11/1998 | Chang et al. |
| 6,166,954 | A | 12/2000 | Chern |
| 6,255,169 | B1 | 7/2001 | Li et al. |
| 6,678,190 | B2 | 1/2004 | Yang et al. |

(Continued)

FOREIGN PATENT DOCUMENTS

| | | |
|---|---|---|
| JP | 08-046067 A | 2/1996 |
| JP | 2004200553 A | 7/2004 |
| JP | 2007173821 A | 7/2007 |

OTHER PUBLICATIONS

U.S. Appl. No. 13/602,404, filed Sep. 4, 2012.
Paola, et al, "Single Poly PMOS-based CMOS-Compatible low voltage OTP", 2005, pp. 953-960, vol. 5837, Proc. of SPIE.

(Continued)

*Primary Examiner* — Thomas L Dickey
*Assistant Examiner* — Joseph Schoenholtz
(74) *Attorney, Agent, or Firm* — WPAT, PC; Justin King

(57) ABSTRACT

An erasable programmable single-poly nonvolatile memory includes a substrate structure; a floating gate transistor having a floating gate, a gate oxide layer under the floating gate, and a channel region, wherein the channel region is formed in a N-well region; and an erase gate region, wherein the floating gate is extended to and is adjacent to the erase gate region and the erase gate region comprises a n-type source/drain region connected to an erase line voltage and a P-well region. The N-well and P-well region are formed in the substrate structure. The gate oxide layer comprises a first portion above the channel region of the floating gate transistor and a second portion above the erase gate region, and a thickness of the first portion of the gate oxide layer is different from a thickness of the second portion of the gate oxide layer.

13 Claims, 5 Drawing Sheets

(56) References Cited

U.S. PATENT DOCUMENTS

| | | |
|---|---|---|
| 7,078,761 B2 | 7/2006 | Wang et al. |
| 8,076,707 B1 | 12/2011 | Hyde et al. |
| 8,592,886 B2 * | 11/2013 | Hsu et al. .................... 257/315 |
| 2004/0065917 A1 | 4/2004 | Fan et al. |
| 2005/0199936 A1 | 9/2005 | Wang et al. |
| 2008/0169500 A1 | 7/2008 | Lojek et al. |
| 2009/0159946 A1 | 6/2009 | Huang et al. |
| 2010/0149874 A1 * | 6/2010 | Leung et al. ............ 365/185.05 |
| 2010/0163956 A1 | 7/2010 | Lee |
| 2010/0329016 A1 | 12/2010 | Taniguchi |
| 2012/0056257 A1 | 3/2012 | Choi et al. |

OTHER PUBLICATIONS

Lin, et al, "A single-poly EEPROM cell structure compatible to standard CMOS process", 2007, pp. 888-893, Solid-State Electronics.

Bartolomeo, et al, "A single-poly EEPROM cell for embedded memory applications", 2009, pp. 644-648, Solid-State Electronics.

Dirk Wellekens, Single Poly Cell as the Best Choice for Radiation-Hard Floating Gate EEPROM Technology, IEEE Transactions on Nuclear Science, vol. 40, No. 6, 1619-1627, Belgium, (1993).

European Patent Office, "Search Report", Jul. 26, 2013.

European Patent Office, "Search Report", Sep. 3, 2013.

Japan Patent Office, "Office Action", Dec. 5, 2013.

* cited by examiner

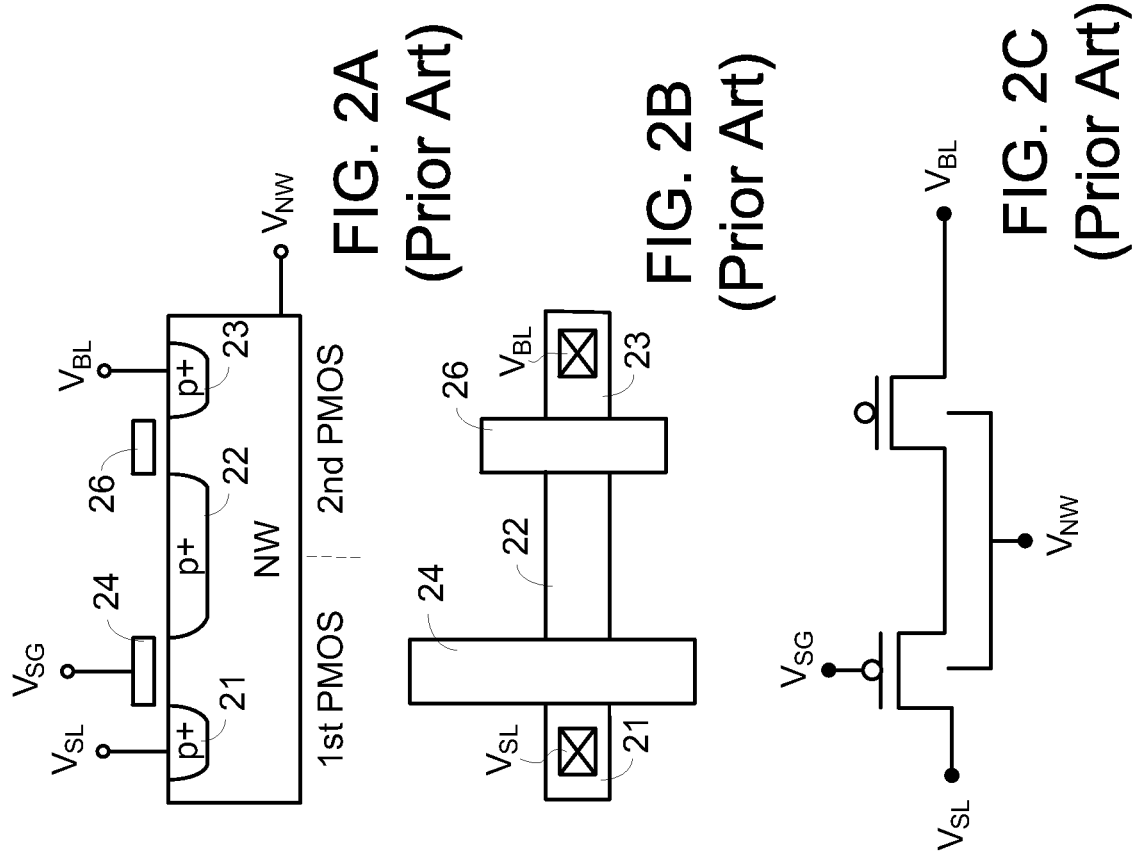
FIG. 2A (Prior Art)
FIG. 2B (Prior Art)
FIG. 2C (Prior Art)
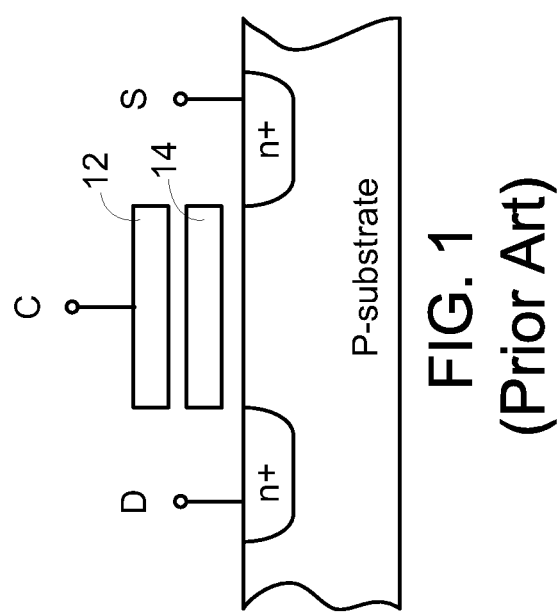
FIG. 1 (Prior Art)

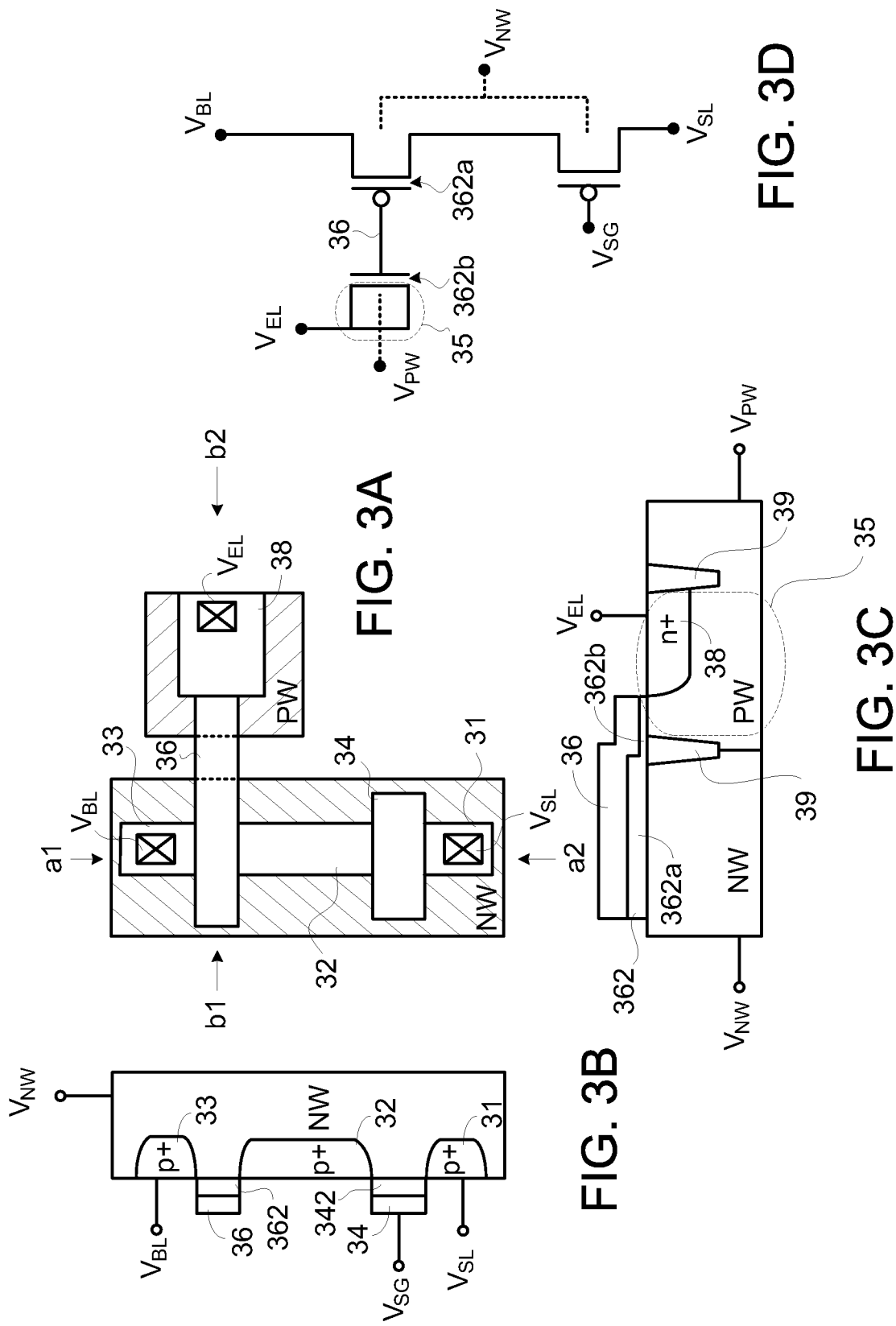

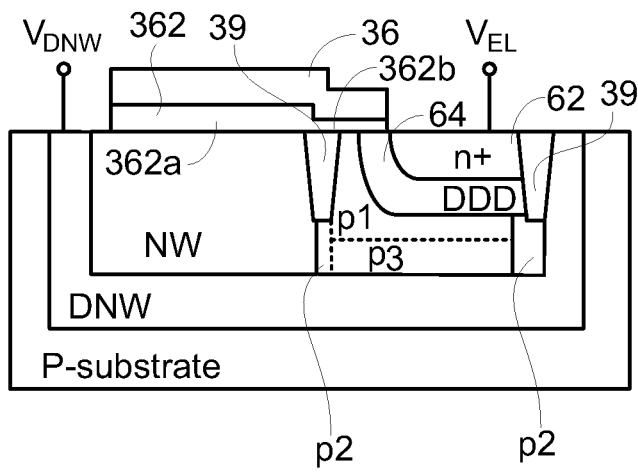
FIG. 7
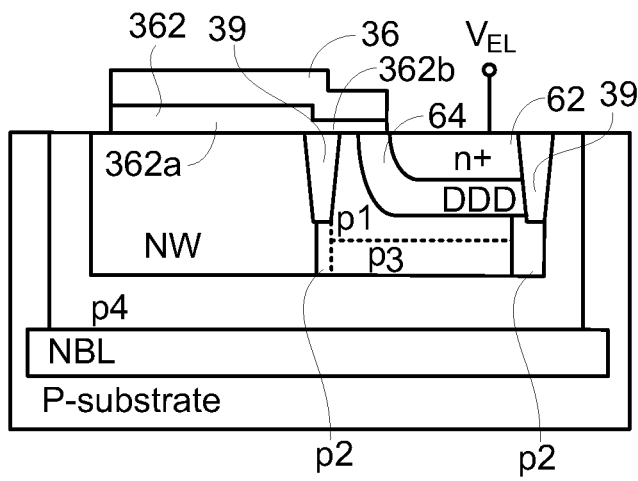
FIG. 8
| | $V_{SL}$ | $V_{NW}$ | $V_{BL}$ | $V_{WL}$ | $V_{EL}$ | $V_{DNW}$ | $V_{PW}$ | mode |
|---|---|---|---|---|---|---|---|---|
| Method1 | 0~$V_{EE}$ | $V_{EE}$ | 0~$V_{EE}$ | $V_{EE}$ | -$V_{ee}$ | $V_{EE}$ | -$V_{ee}$ | FN |
| Method2 | floating | $V_{EE}$ | 0 | $V_{EE}$ | -$V_{ee}$ | $V_{EE}$ | -$V_{ee}$ | BBHH SHH DAHH |
FIG. 9

ERASABLE PROGRAMMABLE SINGLE-PLOY NONVOLATILE MEMORY

This is a continuation-in-part application of co-pending U.S. application Ser. No. 13/572,731, filed Aug. 13, 2012, which is a continuation-in-part application of co-pending U.S. application Ser. No. 13/415,185, filed Mar. 8, 2012, the subject matters of which are incorporated herein by reference.

FIELD OF THE INVENTION

The present invention relates to a nonvolatile memory, and more particularly to an erasable programmable single-poly nonvolatile memory.

BACKGROUND OF THE INVENTION

FIG. 1 is a schematic cross-sectional view illustrating a conventional programmable dual-poly nonvolatile memory. The programmable dual-poly nonvolatile memory is also referred as a floating-gate transistor. As shown in FIG. 1, this nonvolatile memory comprises two stacked and separated gates. The upper gate is a control gate 12, which is connected to a control line C. The lower gate is a floating gate 14. In addition, an n-type doped source region and an n-type doped drain region are constructed in a P-substrate. The n-type doped source region is connected to a source line S. The n-type doped drain region is connected to a drain line D.

In a case that the nonvolatile memory is in a programmed state, a high voltage (e.g. +16V) is provided by the drain line D, a ground voltage is provided by the source line S, and a control voltage (e.g. +25V) is provided by the control line C. Consequently, during the electrons are transmitted from the source line S to the drain line D through an n-channel region, the hot carriers (e.g. hot electrons) are attracted by the control voltage on the control gate 12 and injected into the floating gate 14. Under this circumstance, a great number of carriers are accumulated in the floating gate 14. Consequently, the programmed state may be considered as a first storage state (e.g. "0").

In a case that the nonvolatile memory is in a non-programmed state, no carrier is injected into the floating gate 14, and thus the non-programmed state may be considered as a second storage state (e.g. "1").

In other words, the characteristic curves of the drain current (id) and the gate-source voltage (Vgs) (i.e. an id-Vgs characteristic curve) in the first storage state and the id-Vgs characteristic curve in the second storage state are distinguished. Consequently, the storage state of the floating-gate transistor may be realized according to the variation of the id-Vgs characteristic curve.

However, since the floating gate 14 and the control gate 12 of the programmable dual-poly nonvolatile memory should be separately produced, the process of fabricating the programmable dual-poly nonvolatile memory needs more steps and is incompatible with the standard CMOS manufacturing process.

U.S. Pat. No. 6,678,190 discloses a programmable single-poly nonvolatile memory. FIG. 2A is a schematic cross-sectional view illustrating a conventional programmable single-poly nonvolatile memory disclosed in U.S. Pat. No. 6,678,190. FIG. 2B is a schematic top view illustrating the conventional programmable single-poly nonvolatile memory of FIG. 2A. FIG. 2C is a schematic circuit diagram illustrating the conventional programmable single-poly nonvolatile memory of FIG. 2A.

Please refer to FIGS. 2A~2C. The conventional programmable single-poly nonvolatile memory comprises two serially-connected p-type metal-oxide semiconductor (PMOS) transistors. The first PMOS transistor is used as a select transistor, and a select gate 24 of the first PMOS transistor is connected to a select gate voltage $V_{SG}$. A first source/drain region 21 is connected to a source line voltage $V_{SL}$. Moreover, a second source/drain region 22 may be considered as a combination of a p-type drain region of the first PMOS transistor and a first p-type source region of the second PMOS transistor. A floating gate 26 is disposed over the second PMOS transistor. A third source/drain region 23 of the second PMOS transistor is connected to a bit line voltage $V_{BL}$. Moreover, these PMOS transistors are constructed in an N-well region (NW). The N-well region is connected to an N-well voltage $V_{NW}$. The second PMOS transistor is used as a floating gate transistor.

By properly controlling the select gate voltage $V_{SG}$, the source line voltage $V_{SL}$, the bit line voltage $V_{BL}$ and the N-well voltage $V_{NW}$, the conventional programmable single-poly nonvolatile memory may be operated in a programmed state or a read state.

Since the two PMOS transistors of the conventional programmable single-poly nonvolatile memory have respective gates 24 and 26, the process of fabricating the conventional programmable single-poly nonvolatile memory is compatible with the standard CMOS manufacturing process.

As described in FIGS. 1 and 2, the nonvolatile memory is programmable. The electrical property of the nonvolatile memory is only utilized to inject a great number of hot carriers to the floating gate. However, the electrical property fails to be utilized to remove the carriers from the floating gate. That is, for achieving the data-erasing function, the carriers stored in the floating gate may be removed from the floating gate by exposing ultraviolet (UV) light to the nonvolatile memory. These nonvolatile memories are named as one time programming (OTP) memories.

Therefore, for multi-times programming (MTP) memories design, there is a need of providing an erasable programmable single-poly nonvolatile memory.

SUMMARY OF THE INVENTION

The present invention provides an erasable programmable single-poly nonvolatile memory in order to obviate the drawbacks encountered from the prior art.

The present invention provides an erasable programmable single-poly nonvolatile memory, comprising: a substrate structure; a floating gate transistor comprising a floating gate, a gate oxide layer under the floating gate, and a channel region, wherein the channel region is formed in a N-well region; and an erase gate region, wherein the floating gate is extended to and is adjacent to the erase gate region and the erase gate region comprises a n-type source/drain region connected to an erase line voltage and a P-well region; wherein the N-well region and the P-well region are formed in the substrate structure, the gate oxide layer comprises a first portion above the channel region of the floating gate transistor and a second portion above the erase gate region, and a thickness of the first portion of the gate oxide layer is different from a thickness of the second portion of the gate oxide layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) is a schematic cross-sectional view illustrating a conventional programmable dual-poly nonvolatile memory;

FIG. 2A (prior art) is a schematic cross-sectional view illustrating a conventional programmable single-poly nonvolatile memory disclosed in U.S. Pat. No. 6,678,190;

FIG. 2B (prior art) is a schematic top view illustrating the conventional programmable single-poly nonvolatile memory of FIG. 2A;

FIG. 2C (prior art) is a schematic circuit diagram illustrating the conventional programmable single-poly nonvolatile memory of FIG. 2A;

FIGS. 3A~3D schematically illustrate an erasable programmable single-poly nonvolatile memory according to a first embodiment of the present invention;

FIGS. 7~8 schematically illustrate different substrate structures and P-well region (PW) applied to the embodiment of the present invention; and FIG. 9 shows two voltage biasing methods in erased state.

DETAILED DESCRIPTION OF PREFERRED EMBODIMENTS

Figure 4:
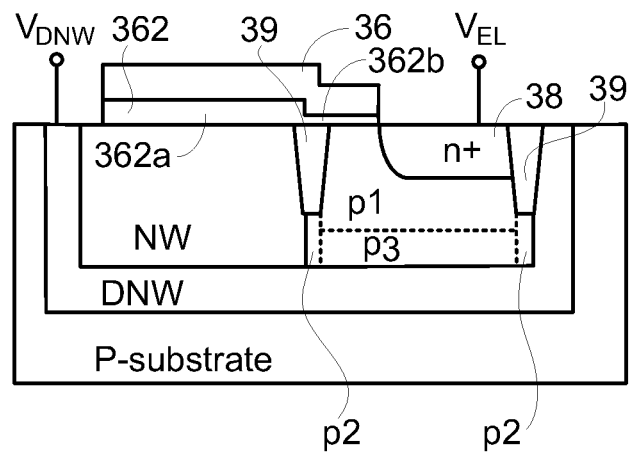
FIGS. 4~5 schematically illustrate different substrate structures and P-well region (PW) applied to the first embodiment of the present invention.

FIGS. 3A~3D schematically illustrate an erasable programmable single-poly nonvolatile memory according to a first embodiment of the present invention. FIG. 3A is a schematic top view illustrating the erasable programmable single-poly nonvolatile memory according to the first embodiment of the present invention. FIG. 3B is a schematic cross-sectional view illustrating the erasable programmable single-poly nonvolatile memory of FIG. 3A and taken along a first direction (a1-a2). FIG. 3C is a schematic cross-sectional view illustrating the erasable programmable single-poly nonvolatile memory of FIG. 3A and taken along a second direction (b1-b2). FIG. 3D is a schematic equivalent circuit diagram of the erasable programmable single-poly nonvolatile memory according to the first embodiment of the present invention. Furthermore, the nonvolatile memory of the present invention is manufactured by using a single poly process, which is compatible with a logical CMOS fabrication process.

As shown in FIGS. 3A and 3B, the erasable programmable single-poly nonvolatile memory of the first embodiment comprises two serially-connected p-type metal-oxide semiconductor (PMOS) transistors. These two PMOS transistors are constructed in an N-well region (NW). Three p-type source/drain regions 31, 32 and 33 are formed in the N-well region (NW). In addition, two polysilicon gates 34 and 36 are spanned over the areas between the three p-type source/drain regions 31, 32 and 33, and gate oxides layer 342 and 362 are formed between the two polysilicon gates 34 and 36 and a top surface of the semiconductor. Moreover, two polysilicon gates 34 and 36 above the N-well region (NW) are P-doped polysilicon gates 34 and 36.

The first PMOS transistor is used as a select transistor, and the polysilicon gate 34 (also referred as a select gate) of the first PMOS transistor is connected to a select gate voltage $V_{SG}$. The first source/drain region 31 is a p-type source region and connected to a source line voltage $V_{SL}$. The second source/drain region 32 is a p-type drain region. Also, the p-type source/drain region 32 may be considered as a combination of the p-type drain region of the first PMOS transistor and a p-type source region of the second PMOS transistor. The polysilicon gate 36 (also referred as a floating gate) is disposed over the second PMOS transistor. The third source/drain region 33 is a p-type drain region of the second PMOS transistor and connected to a bit line voltage $V_{BL}$. Moreover, the second PMOS transistor includes a channel region formed in the N-well region and the N-well region (NW) is connected to an N-well voltage $V_{NW}$. The second PMOS transistor is used as a floating gate transistor.

As shown in FIGS. 3A and 3C, the erasable programmable single-poly nonvolatile memory of the first embodiment comprises an n-type metal-oxide semiconductor (NMOS) transistor or a combination of the floating gate 36, gate oxide layer 362 and an erase gate region 35. The NMOS transistor is constructed in a P-well region (PW). An n-type source/drain region 38 is formed in the P-well region (PW). In other words, the erase gate region 35 includes the P-well region (PW) and the n-type source/drain regions 38. Furthermore, the floating gate 36 above the P-well region (PW) is an N-doped polysilicon gate. Also, the P-well region (PW) can be a P-doped well region and the N-well region can be an N-doped well region.

As shown in FIG. 3A, the floating gate 36 is extended to and is adjacent to the erase gate region 35. Moreover, the n-type source/drain region 38 may be considered as a combination of an n-type source region and an n-type drain region of the NMOS transistor and the floating gate 36 may be considered as a gate of the NMOS transistor. The n-type source/drain region 38 is connected to an erase line voltage $V_{EL}$. In addition, the P-well region (PW) is connected to a P-well voltage $V_{PW}$. As shown in FIG. 3C, the gate oxide layer 362 is formed under the floating gate 36, and the gate oxide layer 362 includes two portions 362a and 362b. The first portion 362a of the gate oxide layer 362 is formed in the floating gate transistor (second PMOS transistor) and the second portion 362b of the gate oxide layer 362 is formed in the NMOS transistor (or above the erase gate region 35). According to the first embodiment of the present invention, an etching back process is adopted to etch the second portion of the gate oxide layer. In this way, a thickness of the first portion 362a of the gate oxide layer 362 is thicker than a thickness of the second portion 362b of the gate oxide layer 362. Furthermore, an isolation structure 39 is formed between the P-well region (PW) and the N-well region (NW). For example, the isolation structure 39 is a shallow trench isolation (STI) structure.

As shown in FIG. 3D, the erase gate region 35 also can be seen as a tunneling capacitor for the storage carriers eject from the floating gate 36 to out of the nonvolatile memory through the tunneling capacitor.

Furthermore, different substrate structures and P-well region (PW) applied to the first embodiment of the present invention will be illustrated in more details as follows. As shown in FIG. 4, the substrate structure includes a deep N-well region (DNW) and a P-substrate. The deep N-well region (DNW) is formed in the P-substrate and the deep N-well region (DNW) is connected to a deep N-well voltage $V_{DNW}$.

The N-well region (NW) and the P-well region (PW) of the first embodiment are formed in the deep N-well region (DNW) of the substrate structure. The P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1).

In addition, the first p-type region (p1) is formed under the surface of the substrate structure and contacted to the n-type source/drain region 38; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 4 of the present invention, the junction breakdown voltage between the n-type source/drain region 38 and the first p-type region (p1) is increased and thus the erase efficiency of the erasable programmable single-poly nonvolatile memory is improved. Furthermore, the two second p-type regions (p2) are capable of improving the lateral punch through effect between the n-type source/drain region 38 and the N-well region (NW); and the third p-type region (p3) is capable of improving the vertical punch through effect between the n-type source/drain region 38 and the deep N-well region (DNW), especially in the high temperature environment.

Figure 5:
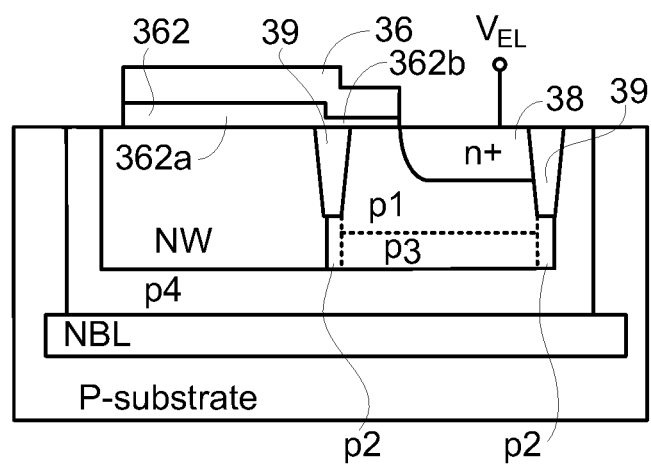

As shown in FIG. 5, the substrate structure includes a fourth p-type region (p4), an n-type barrier layer (NBL, i.e a second n-type region), and a P-substrate. The n-type barrier layer (NBL) is formed in the P-substrate, and the fourth p-type region (p4) is formed above and contacted to the n-type barrier layer (NBL).

The N-well region (NW) and the P-well region (PW) of the first embodiment are formed in the fourth p-type region (p4) of the substrate structure. The P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1). In addition, the dosage in the fourth p-type region (p4) is equal to the dosage in the P-substrate. Or, the dosage in the fourth p-type region (p4) is higher than or equal to the dosage in the third p-type region (p3) and the dosage in the fourth p-type region (p4) is lower than or equal to the dosage in the second p-type region (p2).

In addition, the first p-type region (p1) is formed under the surface of the substrate structure and contacted to the n-type source/drain region 38; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 5 of the present invention, the junction breakdown voltage between the n-type source/drain region 38 and the first p-type region (p1) is increased and thus the erase efficiency of the erasable programmable single-poly nonvolatile memory is improved. Furthermore, the two second p-type regions (p2) are capable of improving the lateral punch through effect between the n-type source/drain region 38 and the N-well region (NW) at higher temperature; and the third p-type region (p3) is capable of improving the vertical punch through effect between the n-type source/drain region 38 and the n-type barrier layer (NBL) at higher temperature. Also, the N-well region (NW) of the first embodiment is isolated by the fourth p-type region (p4) and the P-well region (PW), thus the independent bias voltage is capable of reducing the voltage stress between the floating gate 36 and the N-well region (NW).

Figure 6A:
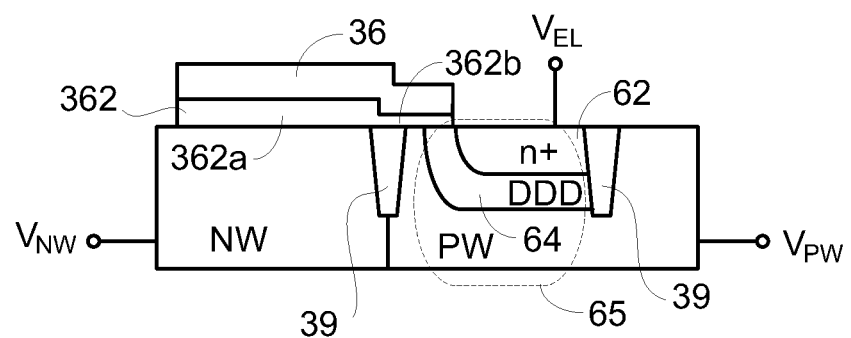
FIGS. 6A~6B schematically illustrate another erase gate region capable of replacing the erase gate region shown in the first embodiment.
Figure 6B:
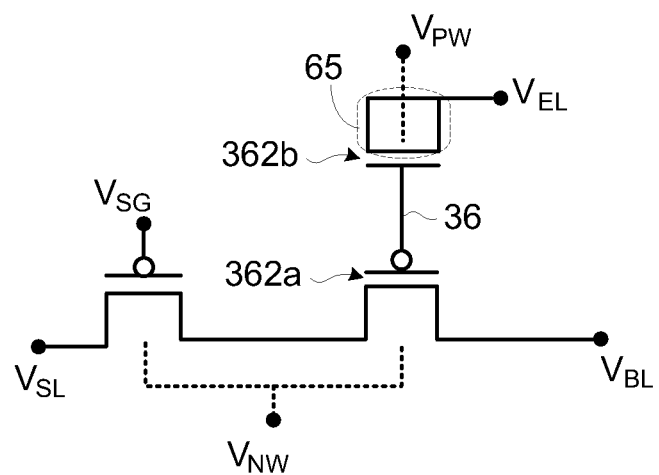

FIGS. 6A~6B schematically illustrate another erase gate region capable of replacing the erase gate region 35 shown in the first embodiment. The structure of the first PMOS transistor (select transistor) and the second PMOS transistor (floating gate transistor) are the same with FIG. 3B, and are not redundantly shown herein.

As shown in FIG. 6A and 6B, there is a double diffused drain (DDD) region 64 (i.e. a first n-type region (n1)) formed between the n-type source/drain regions 62 and the P-well region (PW) in the erase gate region 65 comparing with FIG. 3C. To achieving a lower erase line voltage ($V_{EL}$), a thickness of the second portion 362b of the gate oxide layer 362 is thinner than a thickness of the first portion 362a of the gate oxide 362.

FIG. 6B shows the equivalent circuit diagram of the erasable programmable single-poly nonvolatile memory including the first PMOS transistor, the second PMOS transistor, and the erase gate region 65.

Furthermore, different substrate structures and P-well region (PW) applied to the embodiment shown in FIG. 6A will be illustrated in more details as follows. As shown in FIG. 7, the substrate structure includes a deep N-well region (DNW), and a P-substrate. The deep N-well region (DNW) is formed in the P-substrate and the deep N-well region (DNW) is connected to a deep N-well voltage $V_{DNW}$.

The N-well region (NW) and the P-well region (PW) of the embodiment are formed in the substrate structure. Furthermore, the P-well region (PW) further comprises a first p-type region (p1), two second p-type regions (p2), and a third p-type region (p3). The dosage in the second p-type region (p2) is higher than or equal to the dosage in the first p-type region (p1). The dosage in the third p-type region (p3) is higher than or equal to the dosage in the first p-type region (p1). The dosage in the N-well region (NW) is higher than or equal to the dosage in the first n-type region (n1, i.e. the double diffused drain (DDD) region). Also, the dosage in the first p-type region (p1) is higher than or equal to the dosage in the first n-type region (n1).

In addition, the first p-type region (p1) is formed under the surface of the substrate structure and contacted to the double diffused drain (DDD) region 64; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 7 of the present invention, the junction breakdown voltage between the first n-type region (n1, i.e. the double diffused drain (DDD) region 64) and the first p-type region (p1) is increased and thus the erase efficiency of the erasable programmable single-poly nonvolatile memory is improved. Furthermore, the second p-type regions (p2) are capable of improving the lateral punch through effect between the double diffused drain (DDD) region 64 and the N-well region (NW) at higher temperature; and the third p-type region (p3) is capable of improving the vertical punch through effect between the double diffused drain (DDD) region 64 and the deep N-well region (DNW) at higher temperature.

As shown in FIG. 8, the substrate structure includes a fourth p-type region (p4), an n-type barrier layer (NBL, i.e. a second n-type region), and a P-substrate. The n-type barrier layer (NBL) is formed in the substrate structure, and the fourth p-type region (p4) is formed above and contacted to the n-type barrier layer (NBL).

The N-well region (NW) and the P-well region (PW) of the embodiment are formed in the substrate structure. Furthermore, the P-well region (PW) further comprises a first p-type region (p1), two second p-type regions (p2), and a third p-type region (p3). The dosage in the second p-type region (p2) is higher than or equal to the dosage in the first p-type region (p1). Also, the dosage in the third p-type region (p3) is higher than or equal to the dosage in the first p-type region (p1). In addition, the dosage in the fourth p-type region (p4) is equal to the dosage in the P-substrate. Or, the dosage in the fourth p-type region (p4) is higher than or equal to the dosage in the third p-type region (p3) and the dosage in the fourth p-type region (p4) is lower than or equal to the dosage in the second p-type region (p2).

In addition, the first p-type region (p1) is formed under the surface of the substrate structure and contacted to the double diffused drain (DDD) region 64; and the third p-type region (p3) is formed under the first p-type region (p1). Furthermore, the first p-type region (p1) and the third p-type region (p3) are located between the two second p-type regions (p2), which are formed under the two isolation structures 39.

According to FIG. 8 of the present invention, the junction breakdown voltage between the first n-type region (n1) (i.e. double diffused drain (DDD) region 64) and the first p-type region (p1) is increased and thus the erase efficiency of the erasable programmable single-poly nonvolatile memory is improved. Furthermore, the second p-type region (p2) is capable of improving the lateral punch through effect between the double diffused drain (DDD) region 64 (i.e. the first n type region: n1) and the N-well region (NW) at higher temperature; and the third p-type region (p3) is capable of improving the vertical punch through effect between the double diffused drain (DDD) region 64 and the n-type barrier layer (NBL) at higher temperature. Also, the N-well region (NW) of the first embodiment is isolated by the fourth p-type region (p4) and the P-well region (PW), thus the independent bias voltage is capable of reducing the voltage stress between the floating gate 36 and the N-well region (NW).

According to the present invention, some biasing voltages may provide to the embodiments constructed in the deep N-well region (DNW) of the substrate structure as shown in FIGS. 4 and 7 in the erased state. FIG. 9 shows two voltage biasing methods in erased state. As shown in FIG. 9, when the first method is used in the erased state, the source line voltage $V_{SL}$ and the bit line voltage is in a range between 0V to a positive voltage $V_{EE}$, the N-well voltage $V_{NW}$ and the word line voltage $V_{WL}$ and the deep N-well voltage $V_{DNW}$ is equal to the positive voltage ($V_{EE}$). Whereas, the erase line voltage $V_{EL}$ and the P-well voltage $V_{PW}$ is equal to a negative voltage $-V_{ee}$. The positive voltage $V_{EE}$ is in the range between +6.5V and +18V and the negative voltage $-V_{ee}$ is in the range between −6.5V and −18V. In this way, the ejection of the storage carriers can be achieved by using Fowler-Nordhiem (FN) effect.

As shown in FIG. 9, when the second method is used in the erased state, the source line voltage $V_{SL}$ is floating, and the bit line voltage is in a ground voltage (0V), and the N-well voltage $V_{NW}$ and the word line voltage $V_{WL}$ and the deep N-well voltage $V_{DNW}$ is equal to the positive voltage ($V_{EE}$). Whereas, the erase line voltage $V_{EL}$ and the P-well voltage $V_{PW}$ is equal to a negative voltage $-V_{ee}$. The positive voltage $V_{EE}$ is in the range between +6.5V and +18V and the negative voltage $-V_{ee}$ is in the range between −6.5V and −18V. In this way, the ejection of the storage carriers can be achieved by using Hot Hole (HH) effect, such as, band-to-band hot hole (BBHH) effect, substrate hot hole (SHH) effect, and drain avalanche hot hole (DAHH) effect.

From the above description, the erasable programmable single-poly nonvolatile memory of the present invention is capable of decreasing the erase line voltage ($V_{EL}$). That is, by providing a lower erase line voltage $V_{EL}$, storage state of the nonvolatile memory of the present invention is changeable.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An erasable programmable single-poly nonvolatile memory, comprising:
    a substrate structure;
    a floating gate transistor comprising a floating gate, a gate oxide layer under the floating gate, and a channel region, wherein the channel region is formed in a N-well region; and
    an erase gate region, wherein the floating gate is extended to and is adjacent to the erase gate region and the erase gate region comprises a P-well region, a n-type source/drain region connected to an erase line voltage and a first n-type region formed between the n-type source/drain region and the P-well region;
    wherein the P-well region comprises: a first p-type region formed under a surface of the substrate structure and contacted to a first n-type region; a plurality of second p-type regions; and a third p-type region formed under the first p-type region;
    wherein, the first p-type region and the third p-type regions are located between the second p-type regions; and
    wherein the first n-type region is a double diffused drain region, the N-well region and the P-well region are formed in the substrate structure, the gate oxide layer comprises a first portion above the channel region of the floating gate transistor and a second portion above the erase gate region, and a thickness of the first portion of the gate oxide layer is different from a thickness of the second portion of the gate oxide layer.

2. The erasable programmable single-poly nonvolatile memory as claimed in claim 1, wherein a dosage in the second p-type regions is higher than or equal to a dosage in the first p-type region, and a dosage in the third p-type region is higher than or equal to the dosage in the first p-type region.

3. The erasable programmable single-poly nonvolatile memory as claimed in claim 1, wherein the substrate structure comprises:
    a P-substrate; and
    a deep N-well region formed in the P-substrate, wherein the deep N-well region is contacted to the N-well region, the second p-type regions and the third p-type region and the deep N-well region is connected to a deep N-well voltage.

4. The erasable programmable single-poly nonvolatile memory as claimed in claim 3, wherein a dosage in the first p-type region is higher than or equal to the dosage in the first n-type region.

5. The erasable programmable single-poly nonvolatile memory as claimed in claim 1, wherein the substrate structure comprises:
- a P-substrate;
- a second n-type region formed in the P-substrate; and
- a fourth p-type region formed above and contacted to the n-type barrier layer, wherein the fourth p-type region is contacted to the N-well region, the second p-type regions and the third p-type region.

6. The erasable programmable single-poly nonvolatile memory as claimed in claim 5, wherein a dosage in the fourth p-type region is higher than or equal to a dosage in the P-substrate.

7. The erasable programmable single-poly nonvolatile memory as claimed in claim 5, wherein a dosage in the fourth p-type region is higher than or equal to a dosage in the third p-type region, and the dosage in the fourth p-type region is lower than or equal to a dosage in the second p-type region.

8. An erasable programmable single-poly nonvolatile memory, comprising:
- a substrate structure;
- a floating gate transistor comprising a floating gate, a gate oxide layer under the floating gate, and a channel region, wherein the channel region is formed in a N-well region; and
- an erase gate region, wherein the floating gate is extended to and is adjacent to the erase gate region and the erase gate region comprises a P-well region and a n-type source/drain region connected to an erase line voltage;
- wherein the P-well region comprises: a first p-type region formed under a surface of the substrate structure and contacted to the n-type source/drain region; a plurality of second p-type regions; and a third p-type region formed under the first p-type region;
- wherein, the first p-type region and the third p-type regions are located between the second p-type regions; and
- wherein the N-well region and the P-well region are formed in the substrate structure, the gate oxide layer comprises a first portion above the channel region of the floating gate transistor and a second portion above the erase gate region, and a thickness of the first portion of the gate oxide layer is different from a thickness of the second portion of the gate oxide layer.

9. The erasable programmable single-poly nonvolatile memory as claimed in claim 8, wherein a dosage in the second p-type regions is higher than or equal to a dosage in the first p-type region, and a dosage in the third p-type region is higher than or equal to the dosage in the first p-type region.

10. The erasable programmable single-poly nonvolatile memory as claimed in claim 8, wherein the substrate structure comprises:
- a P-substrate; and
- a deep N-well region formed in the P-substrate, wherein the deep N-well region is contacted to the N-well region, the second p-type regions and the third p-type region.

11. The erasable programmable single-poly nonvolatile memory as claimed in claim 8, wherein the substrate structure comprises:
- a P-substrate;
- a second n-type region formed in the P-substrate;
- a fourth p-type region formed above and contacted to the n-type barrier layer, wherein the fourth p-type region is contacted to the N-well region, the second p-type regions and the third p-type region.

12. The erasable programmable single-poly nonvolatile memory as claimed in claim 11, wherein a dosage in the fourth p-type region is higher than or equal to a dosage in the P-substrate.

13. The erasable programmable single-poly nonvolatile memory as claimed in claim 11, wherein a dosage in the fourth p-type region is higher than or equal to a dosage in the third p-type region, and the dosage in the fourth p-type region is lower than or equal to a dosage in the second p-type region.

* * * * *